(12) United States Patent
Chen et al.

(10) Patent No.: US 7,342,809 B2
(45) Date of Patent: Mar. 11, 2008

(54) MOUNTING APPARATUS FOR MOTHERBOARD

(75) Inventors: Yun-Lung Chen, Tu-Cheng (TW); Yong-Chao Zou, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 398 days.

(21) Appl. No.: 11/019,905

(22) Filed: Dec. 21, 2004

(65) Prior Publication Data

US 2005/0190544 A1    Sep. 1, 2005

(30) Foreign Application Priority Data

Feb. 28, 2004    (CN)    ........................ 200420043231.2

(51) Int. Cl.
*H05K 7/18* (2006.01)
(52) U.S. Cl. ...................................... 361/801; 361/759
(58) Field of Classification Search ................ 361/726, 361/735, 740, 747, 759, 801, 807; 174/138 D, 174/138 E; 312/216
See application file for complete search history.

(56) References Cited

U.S. PATENT DOCUMENTS 6,385,051 B1 * 5/2002 Perez et al. .................. 361/759
6,424,540 B1   7/2002 Chen et al.
2004/0125575 A1 * 7/2004 Chen et al. ................. 361/759

FOREIGN PATENT DOCUMENTS

TW        456534        9/2001

* cited by examiner

*Primary Examiner*—Tuan T. Dinh
*Assistant Examiner*—Abiy Getachew
(74) *Attorney, Agent, or Firm*—Morris Manning Martin LLP; Tim Tingkang Xia, Esq.

(57) ABSTRACT

A mounting apparatus for securing a motherboard (30) defining several locking holes (32) includes a chassis (10), a lever (20) and a tray (40). The chassis includes a bottom panel (11) and a mounting member (14). Several standoffs (17, 18) are arranged at the bottom panel. A locating portion (144) is formed on the mounting member. The lever pivotally mounted on the bottom panel includes a securing end (242). A fixing post (224) protrudes from the lever. The tray supporting the motherboard defines an opening (442) for receiving the fixing post therein. The lever is rotated from an unlocked position to a locked position. The fixing post pushes the tray. The motherboard slides on the bottom panel until the securing end is disposed on the locating portion. The motherboard is thus mounted in the chassis.

19 Claims, 6 Drawing Sheets

MOUNTING APPARATUS FOR MOTHERBOARD

CROSS-REFERENCE TO RELATED APPLICATIONS

This application is related to a copending U.S. patent application entitled "MOUNTING APPARATUS FOR MOTHERBOARDS", filed on Dec. 21, 2004 with application Ser. No. 11/019,819 with the same applicants and assignee as the invention. The disclosure of the above identified application is incorporated herein by reference.

BACKGROUND OF THE INVENTION

1. Field of the Invention

The present invention relates to mounting apparatuses, and more particular to a mounting apparatus for readily and securely mounting a motherboard in a computer and readily releasing the motherboard from the computer.

2. Description of the Related Art

Generally, a motherboard is needed in a computer to contact other elements for providing base functions. It is required that the motherboard should be securely mounted in the computer.

Screws are oftentimes used as a traditional mounting apparatus to mount a motherboard defining a plurality of mounting holes. The chassis comprises a bottom panel having a plurality of posts. A screw hole is defined at a top of each of the posts. In assembly, a screwdriver is needed to make a plurality of the screws insert the mounting holes and engaging with the screw holes to mount the motherboard to the bottom panel of the chassis. In disassembly, the screwdriver is also needed to take out the screws for removing the motherboard. It is obviously inconvenience and cumbersome for many screws used in installing and removing the motherboard.

Another mounting apparatus is disclosed in Taiwan Patent Application No. 88209977. A motherboard defines a plurality of mounting holes therein. A chassis of a computer comprises a bottom panel. A plurality of standoffs is arranged at the bottom panel. Each of the standoffs comprises a first portion and a second portion. The first portion is a cone. The maximal diameter of the first portion is greater than a diameter of the second portion and a diameter of the mounting holes of the motherboard. The diameter of the mounting hole of the motherboard is greater than that of the second portions of the standoffs. Each of the standoffs further defines four apertures to make the standoffs resiliently deforming. The mounting holes of the motherboard are aligned with the standoffs. The first portions of standoffs pass through the corresponding mounting holes. The second portions of the standoffs are secured in the mounting holes. The motherboard is thus mounted on the chassis. It is convenient to disassemble the motherboard by pulling its sides. However, when the motherboard is assembled to the chassis, or removed from the chassis, electrical elements, such as capacitances, arranged at the sides of the motherboard may be damaged for being pressed. Moreover, it is usually injured in assembly and disassembly for being scraped by other elements, such as a bracket of storage devices, because of a limit space of the chassis of the computer.

Thus an improved mounting apparatus for a motherboard which overcomes the above-mentioned drawbacks is desired.

SUMMARY OF THE INVENTION

Accordingly, an object of the present invention is to provide a mounting apparatus for readily and efficiently installing a motherboard to and removing the motherboard from a chassis of a computer.

To achieve the aforementioned object, a mounting apparatus of the present invention is used for securing a motherboard to a computer. A plurality of holes is defined in the motherboard. The mounting apparatus comprises a chassis, a mounting member, a lever and a tray. The chassis comprises a bottom panel. A plurality of standoffs is arranged at the bottom panel corresponding to the locking holes of the motherboard. A mounting member is mounted on the bottom panel. A locating portion is formed on the mounting member. A lever pivotally mounted on the bottom panel. The lever comprises a securing end. A fixing post protrudes from the lever. A tray is mounted to the motherboard. An opening is defined in the tray for receiving the fixing post of the lever. The lever is rotated from an unlocked position to a locked position, during which the fixing post of the lever pushes the tray to slide on the bottom panel until the securing end of the lever is secured on the locating portion of the mounting member, and the standoffs are secured in the locking holes of the motherboard, and the motherboard is thus mounted in the chassis.

Other objects, advantages and novel features of the present invention will be drawn from the following detailed description of the preferred embodiment of the present invention with attached drawings, in which:

DETAIL DESCRIPTION OF THE INVENTION

Figure 1:
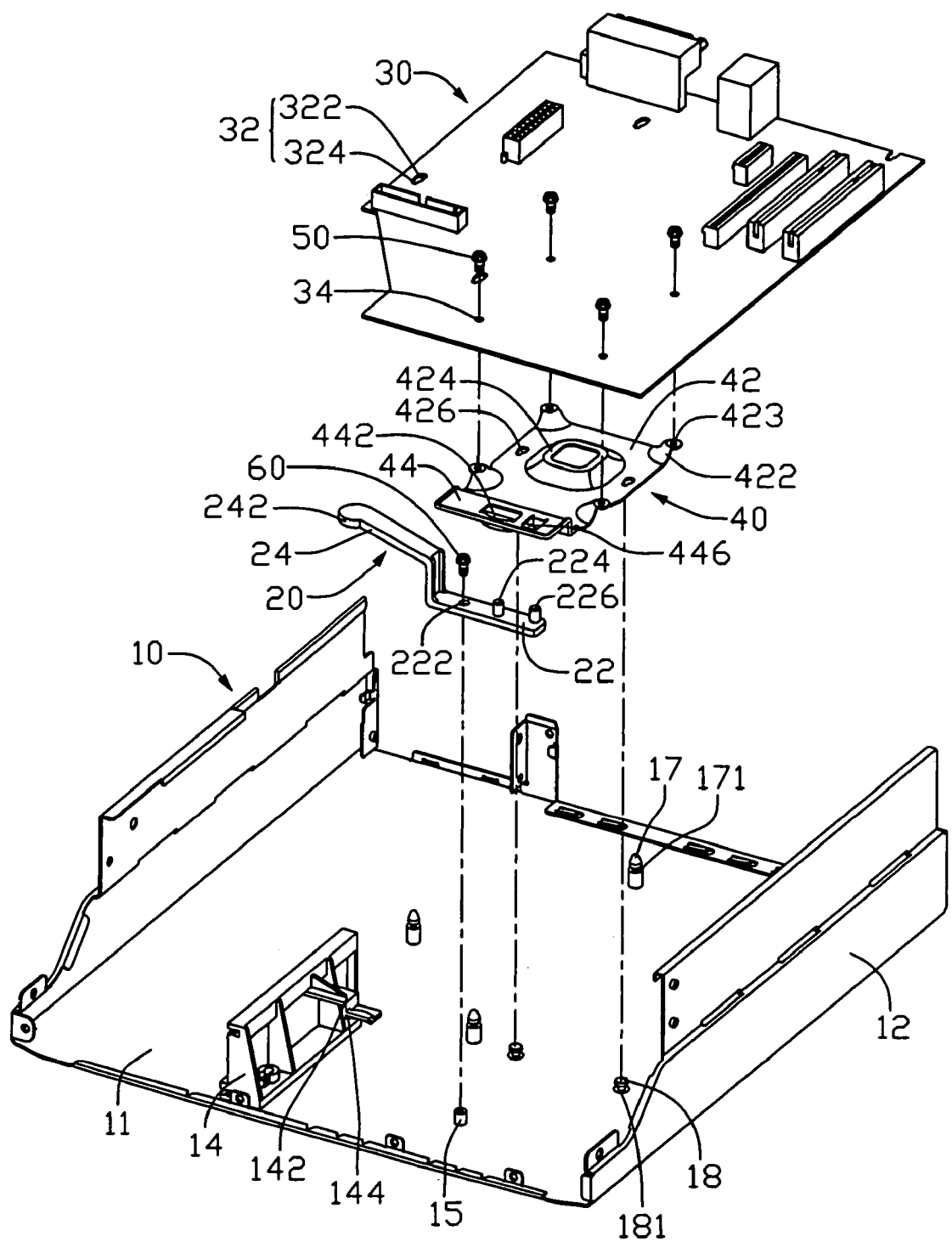
FIG. 1 is an exploded, isometric view of a mounting apparatus in accordance with the preferred embodiment of the present invention, together with a motherboard, the mounting apparatus comprising a chassis, a lever and a tray.

Referring to FIG. 1, a mounting apparatus in accordance with the preferred embodiment of the present invention is used to secure a motherboard 30 to a chassis 10 of an electronic device like a computer. The mounting apparatus comprises the chassis 10, a lever 20 and a tray 40.

The chassis 10 comprises a bottom panel 11 and a side panel 12 extending upwardly from a side of the bottom panel 11. A mounting member 14 is fastened on the bottom panel 11. A projecting portion 142 protrudes from a top portion of the mounting member 14 towards the side panel 12. A locating portion 144 is formed at a distal end of the projecting portion 142, and forms a step at a bottom. A rotation post 15 is mounted on the bottom panel 11 between the mounting member 14 and the side panel 12. A screw hole (not labeled) is defined at a top of the rotation post 15. The bottom panel 11 further comprises a plurality of first standoffs 17 and second standoffs 18 extending upwardly therefrom. An annular groove 171 is defined in each of the first standoffs 17. A diameter of an upper portion of each of the second standoffs 18 is greater than that of a lower portion thereof.

The lever 20 comprises a pulling portion 22 and an L-shaped engaging portion 24 extending upwardly from an end of the pulling portion 22. A first fixing post 224 and a second fixing post 226 protrude upwardly from the pulling portion 22. A hole 222 is defined in the pulling portion 22 adjacent to the engaging portion 24 for receiving the rotation post 15. The engaging portion 24 comprises a securing end 242 at a distal end for being received on the locating portion 144 of the mounting member 14.

The motherboard 30 defines a plurality of locking holes 32 corresponding to the first standoffs 17 and a plurality of screw holes 34 therein. Each of the locking holes 32 comprises a guiding hole 322 and a securing hole 324. A diameter of the guiding hole 322 is greater than that of the securing hole 324. The diameter of the securing hole 324 is smaller than that of the first standoff 17, but greater than that of a portion at the groove 171.

Figure 2:
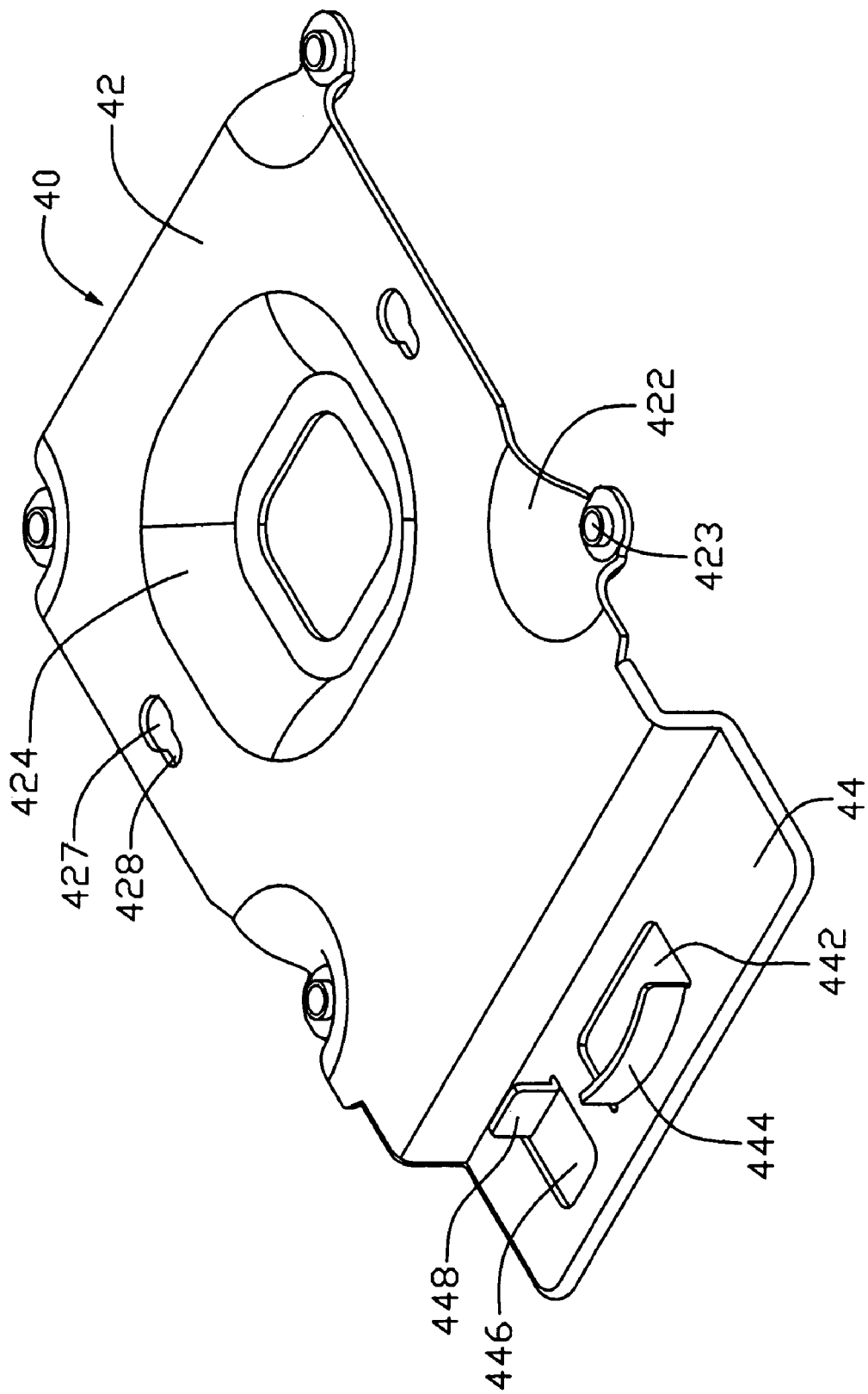
FIG. 2 is an enlarged view of the tray of FIG. 1, but viewed from another aspect.
Figure 3:
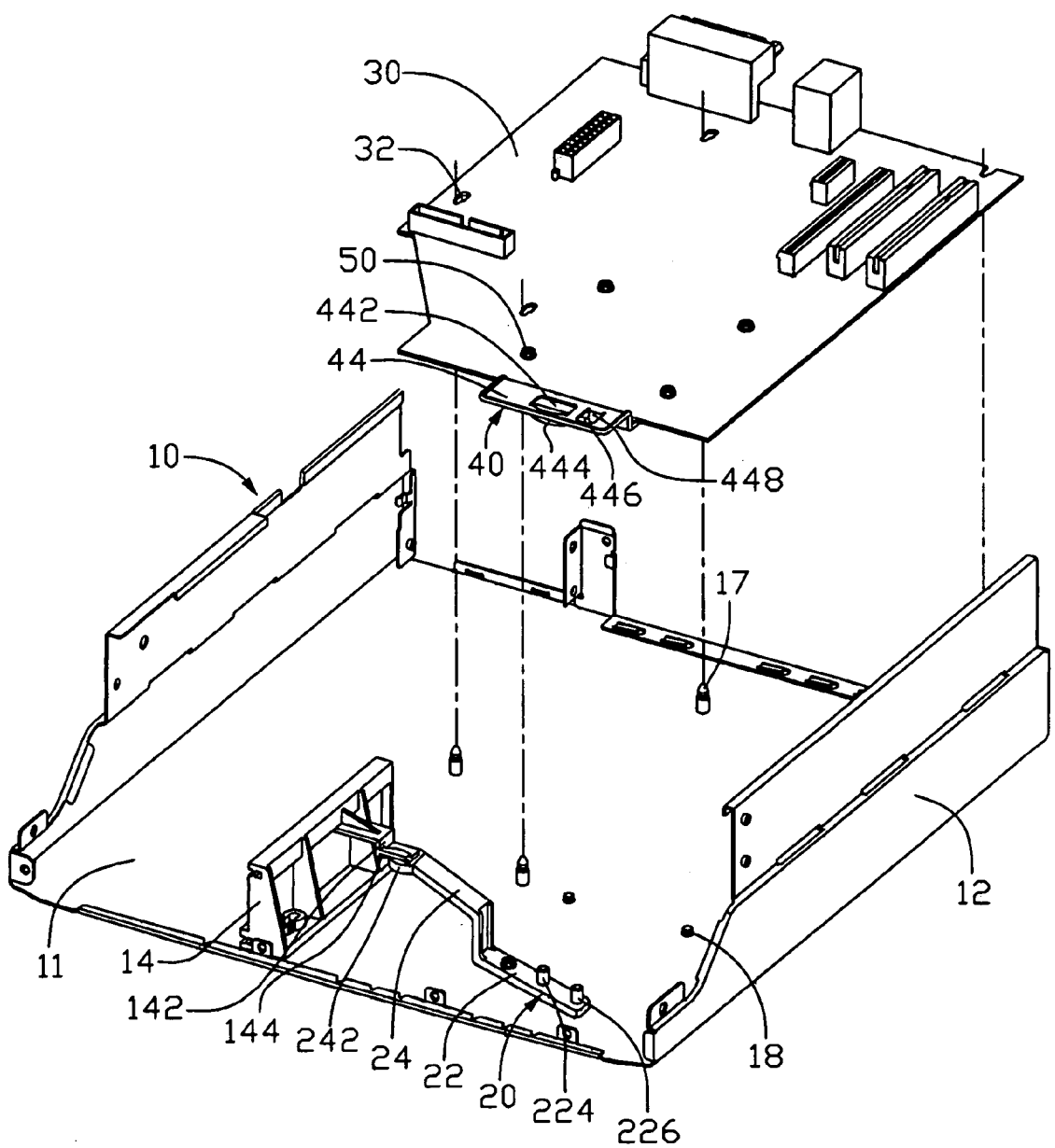
FIG. 3 is similar to FIG. 1, but showing the motherboard being mounted on the tray and the lever being secured to the chassis.
Figure 4:
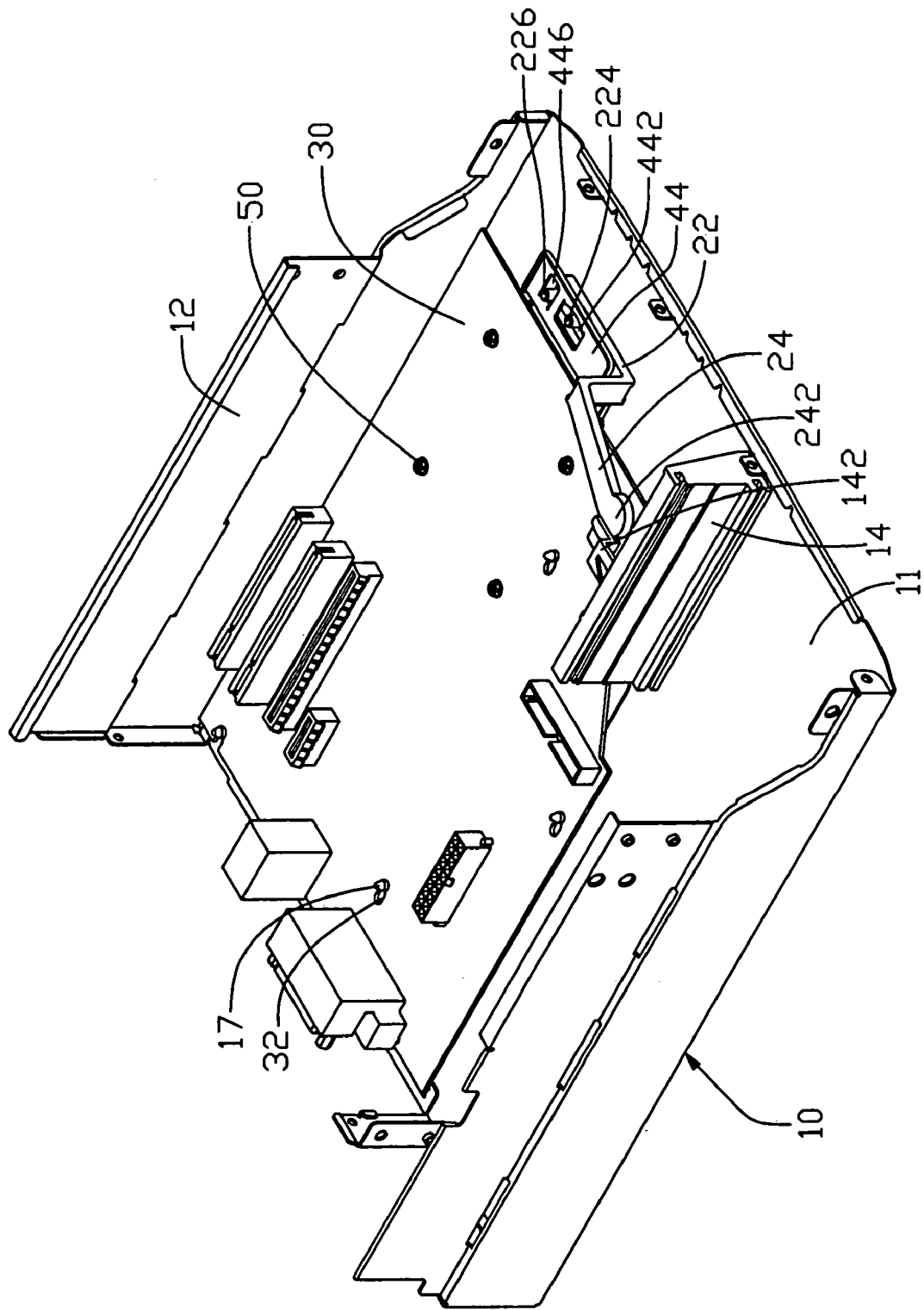
FIG. 4 is an assembled view of the mounting apparatus and the motherboard.
Figure 5:
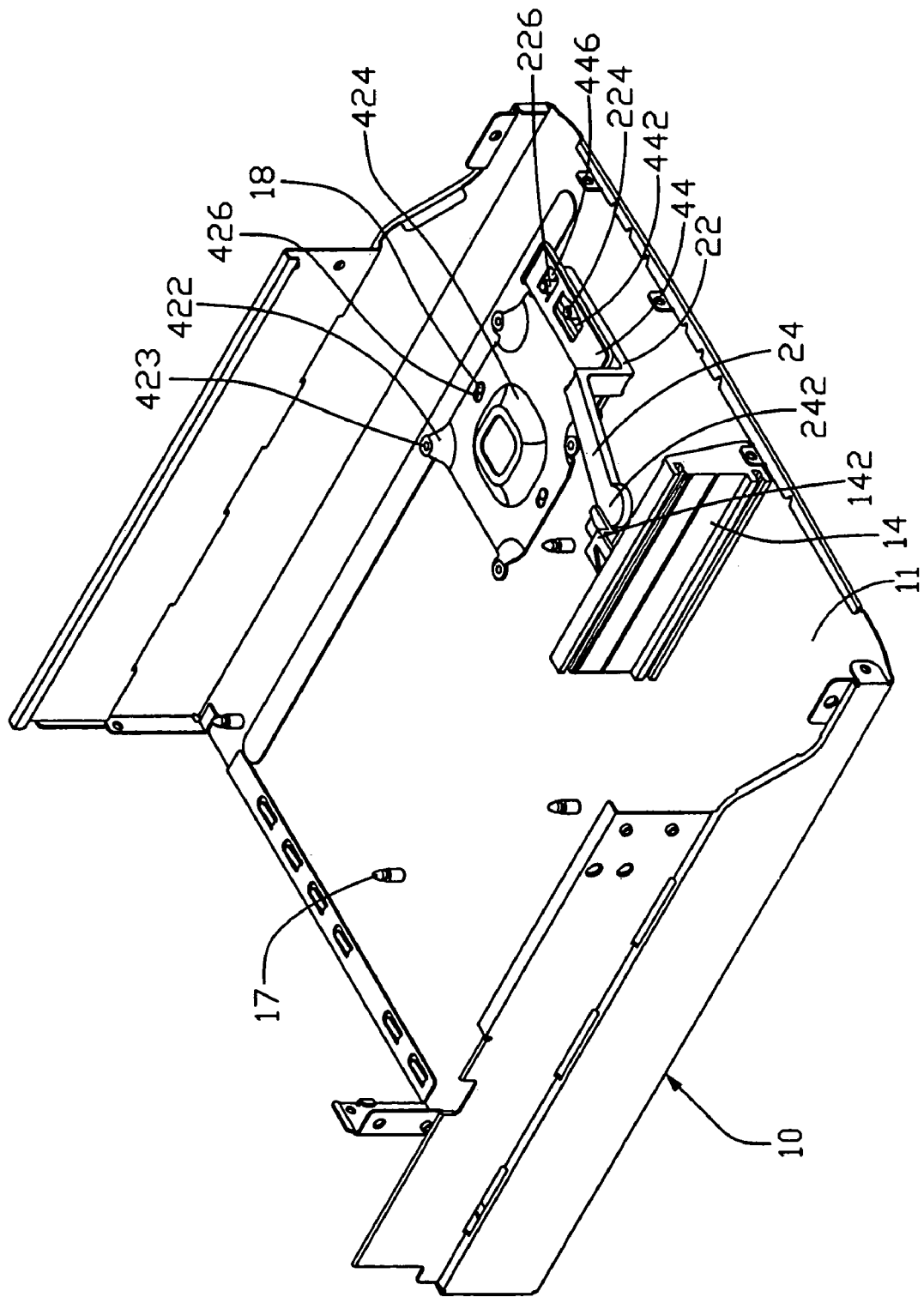
FIG. 5 is similar to FIG. 4, but hiding the motherboard and showing the tray in a locked position.
Figure 6:
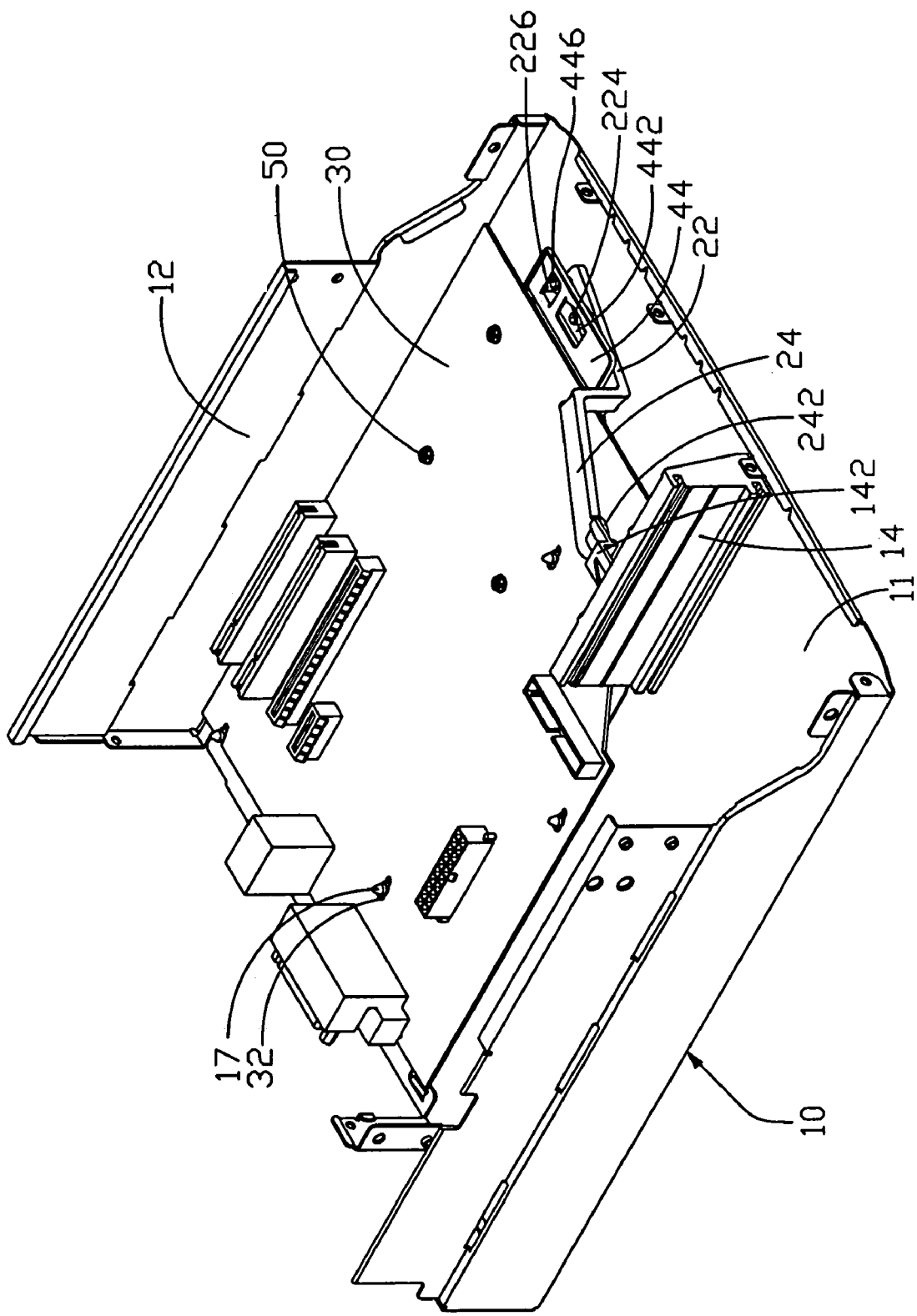
FIG. 6 is similar to FIG. 4, but showing tray supporting the motherboard in an unlocked position.

Referring also to FIG. 2, the tray 40 comprises a plate 42 and an L-shaped extension portion 44 extending from an front side of the plate 42. A protrusion 422 protrudes from each of corners of the plate 42. A screw hole 423 is defined in each of the protrusions 422 corresponding to the screw hole 34 of the motherboard 30. A supporting portion 424 protrudes from the plate 42 in the middle. A plurality of locking holes 426 is defined in the plate 42 at both sides of the supporting portion 424 corresponding to the second standoffs 18 of the bottom panel 11. Each of the locking holes 426 having a same shape as the locking hole 32 of the motherboard 30 comprises a guiding hole 427 and a securing hole 428. The securing hole 428 has a smaller diameter than that of the guiding hole 427. The diameter of the guiding hole 427 is greater than the diameter of the upper portion of the second standoff 18. The diameter of the securing hole 428 is smaller than that of the upper portion of the second standoff 18, but greater than that of the lower portion of the second standoff 18. The first opening 442 and the second openings 446 are defined in the extension portion 44 respectively for receiving the first fixing post 224 and the second fixing post 226 of the lever 20. A first tab 444 extends downwardly from an outer side of the first opening 442. A second tab 446 extends downwardly from an inner side of the second opening 448.

Referring also to FIGS. 3 to 6, in assembly, the rotation post 15 of the bottom panel 11 is received in the hole 222 of the lever 20. A fastener 60 is then inserted into the screw hole of the rotation post 15. The lever 20 is thus pivotally mounted on the bottom panel 11 of the chassis 10. A plurality of fasteners 50 extends through the screw holes 34 of the motherboard 30 engaging with the screw holes 423 of the plate 42. The motherboard 20 is thus mounted on the tray 40. The first standoffs 17, 18 are respectively inserted into the corresponding guiding holes 322, 427. The first fixing post 224 is inserted into the first opening 442 and depends on the first tab 444. The second fixing post 226 is inserted into the second opening 446, and apart away from the second tab 448. The securing end 242 of the lever 20 is disposed under the projecting portion 142 of the mounting member 14.

The engaging portion 24 of the lever 20 is pressed downwardly and rotates backward. The first fixing post 224 is apart away from the first tab 444. The second fixing post 226 depends on the second tab 448 and pushes the second tab 448. The motherboard 30 together with the tray 40 thus moves forward. When the securing end 242 of the lever 20 is secured on the locating portion 144 of the mounting member 14, the lever 20 is fixed to the mounting member 14. The first standoffs 17 and the second standoffs 18 are respectively locked in the corresponding securing holes 324, 428. The motherboard 30 is thus mounted on the bottom panel 11 of the chassis 10.

The engaging portion 24 of the lever 20 is pressed downwardly and rotates forward. The securing end 242 of the engaging portion 24 is released from the locating portion 144. The pulling portion 22 rotates backward around the rotation post 15. The second fixing post 226 of the lever 20 is apart away from the second tab 448, and the first fixing post 224 depends on the first tab 444 and pushes the first tab 444 to move backward. The motherboard 30 together with the tray 40 slides backward until the first standoffs 17 and the second standoffs 18 respectively slide into the corresponding guiding holes 322, 427. The securing end 242 is disposed under the projecting portion 142 and the lever 20 is unlocked. The motherboard 30 thus can be taken out from the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extending indicated by the broad general meaning of the terms in which the appended claims are expressed.

What is claimed is:

1. A mounting apparatus for securing a motherboard defining a plurality of locking holes comprising:
    a chassis comprising a bottom panel having a plurality standoffs extending therefrom for being received in the locking holes of the motherboard;
    a mounting member mounted on the bottom panel, a locating portion being formed on the mounting member;
    a lever pivotally mounted on the bottom panel, the lever comprising a securing end, a fixing post protruding from the lever; and
    a tray supportingly securing with the motherboard, an opening being defined in the tray for receiving the fixing post of the lever;
    wherein the lever is rotated from an unlocked position to a locked position, during which the fixing post of the lever pushes the tray to slide on the bottom panel until the securing end of the lever is secured on the locating portion of the mounting member, and the standoffs are secured in the locking holes of the motherboard, and the motherboard is thus mounted in the chassis.

2. The mounting apparatus as described in claim 1, wherein each of the locking holes of the motherboard comprises a guiding hole and a securing hole, the guiding hole has a greater diameter than that of the securing hole.

3. The mounting apparatus as described in claim 2, wherein a diameter of a head of each of the standoffs is smaller than that of the guiding hole, but greater than that of the securing hole.

4. The mounting apparatus as described in claim 3, wherein a groove is defined in an outer surface of each of the standoffs, a diameter of a portion at the groove is smaller than that of the securing hole of the motherboard.

5. The mounting apparatus as described in claim 1, wherein a projecting portion extends from the mounting member, the locating portion is formed at a distal end of the projecting portion, and forms a step for the securing end abutting there against.

6. The mounting apparatus as described in claim 1, wherein the lever comprises a pulling portion and an engaging portion extending from the pulling portion, the securing end is formed at a distal end of the engaging portion, the fixing post protrudes from the pulling portion.

7. The mounting apparatus as described in claim 6, wherein a rotation post is mounted on the bottom panel of the chassis, a hole is defined in the pulling portion of the lever for receiving the rotation post to pivotally fix the lever to the bottom panel.

8. The mounting apparatus as described in claim 1, wherein the tray comprises a plate and an extension portion projecting from the plate, two tabs extend from two opposite sides of the opening of the extension portion for blocking the fixing post of the lever.

9. A mounting apparatus for securing a motherboard defining a plurality of locking holes, the mounting apparatus comprising:
    a chassis comprising a bottom panel having a plurality standoffs extending therefrom for being received in the locking holes of the motherboard;
    a mounting member arranged in the chassis, and having a locating portion;
    a lever pivotally mounted to the bottom panel, the lever comprising an engaging portion at one end and a pulling portion at the other end, a fixing post formed from the pulling portion; and
    a tray attached to the motherboard, the tray having two restricting portions, the fixing post of the lever being disposed between the restricting portions;
    wherein when the engaging portion of the lever is moved forward, the fixing post drives the tray and the motherboard backward until the standoffs abut against ends of the locking holes, the engaging portion is then engaged with the locating portion of the mounting member to be prevented from moving backward.

10. The mounting apparatus as described in claim 9, wherein each of the locking holes of the motherboard comprises a guiding hole and a securing hole, the guiding hole has a greater diameter than that of the securing hole, said end of the each of the locking holes is at the securing hole.

11. The mounting apparatus as described in claim 10, wherein a diameter of a head of each of the standoffs is smaller than that of the guiding hole, but greater than that of the securing hole.

12. The mounting apparatus as described in claim 11, wherein a groove is defined in an outer surface of each of the standoffs, a diameter of portion at the groove is smaller than that of the securing hole of the motherboard.

13. The mounting apparatus as described in claim 9, wherein a projecting portion extends from the mounting member, the locating portion is formed at a distal end of the projecting portion.

14. The mounting apparatus as described in claim 9, wherein a rotation post is mounted on the bottom panel of the chassis, a hole is defined in the pulling portion of the lever for receiving the rotation post to pivotally fasten the lever to the bottom panel.

15. The mounting apparatus as described in claim 9, wherein the tray comprises a plate supporting the motherboard and an extension portion projecting from the plate, the restricting portions are formed on the extension portion.

16. The mounting apparatus as described in claim 15, wherein an opening is defined in the extension portion, the restricting portions are two opposite sides of the opening.

17. The mounting apparatus as described in claim 15, wherein the restricting portions are two tabs formed downwardly from the extension portion.

18. A mounting apparatus for mounting a circuit board to a chassis of an electronic device, comprising: a tray securely attachable to said circuit board and movable together therewith, said tray having an extension portion formed beside said circuit board; and a lever pivotally mounted to said chassis, and having a first end engagable with said extension portion, and a second end opposite to said first end and accessible to apply a driving force thereon for controlling movement of said tray and said circuit board, and said second end moving under said driving force along a direction opposing to another direction of said first end, wherein two posts are formed on said first end of said level and receivable in corresponding opening formed in said extension portion of said tray to perform engagement between said first end and said extension portion.

19. The mounting apparatus as described in claim 18, further comprising a mounting member secured to said chassis and snappingly engageble with said second end to securely position said lever.

* * * * *